(12) United States Patent
Matsukura

(10) Patent No.: US 10,872,907 B2
(45) Date of Patent: *Dec. 22, 2020

(54) SEMICONDUCTOR DEVICE

(71) Applicant: SEMICONDUCTOR ENERGY LABORATORY CO., LTD., Atsugi (JP)

(72) Inventor: Hideki Matsukura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/689,134

(22) Filed: Nov. 20, 2019

(65) Prior Publication Data

US 2020/0091201 A1    Mar. 19, 2020

Related U.S. Application Data

(63) Continuation of application No. 14/337,575, filed on Jul. 22, 2014, now Pat. No. 10,529,740.

(30) Foreign Application Priority Data

Jul. 25, 2013   (JP) ................. 2013-154537

(51) Int. Cl.
*H01L 27/12*   (2006.01)
*H01L 29/786*  (2006.01)
*H01L 27/07*   (2006.01)
*H01L 29/423*  (2006.01)
*H01L 29/417*  (2006.01)

(52) U.S. Cl.
CPC ...... *H01L 27/1225* (2013.01); *H01L 27/0705* (2013.01); *H01L 27/124* (2013.01); *H01L 29/41733* (2013.01); *H01L 29/42384* (2013.01); *H01L 29/7869* (2013.01); *H01L 29/78648* (2013.01)

(58) Field of Classification Search
CPC ............ H01L 27/1225; H01L 27/124; H01L 27/0705; H01L 27/1222; H01L 29/41733; H01L 29/42384; H01L 29/78648; H01L 29/7869; H01L 29/78696
See application file for complete search history.

(56) References Cited

U.S. PATENT DOCUMENTS

| 3,896,483 | A  | 7/1975 | Whelan |
| 5,731,856 | A  | 3/1998 | Kim et al. |
| 5,744,864 | A  | 4/1998 | Cillessen et al. |
| 6,218,206 | B1 | 4/2001 | Inoue et al. |
| 6,294,274 | B1 | 9/2001 | Kawazoe et al. |

(Continued)

FOREIGN PATENT DOCUMENTS

| EP | 1737044 A | 12/2006 |
| EP | 2226847 A | 9/2010 |

(Continued)

OTHER PUBLICATIONS

Machine translation, Yamazaki, Japanese Pat. Pub. No. JP 2010-123925, translation date: Aug. 4, 2020, Espacenet, all pages. (Year: 2020).*

(Continued)

*Primary Examiner* — Victoria K. Hall
(74) *Attorney, Agent, or Firm* — Nixon Peabody LLP; Jeffrey L. Costellia

(57) ABSTRACT

Two dual-gate transistors, which are electrically connected in parallel and provided in a compact design, are disclosed.

20 Claims, 12 Drawing Sheets

(56) References Cited

U.S. PATENT DOCUMENTS

| | | | |
|---|---|---|---|
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,514,712 B2 | 4/2009 | Araki | |
| 7,674,650 B2 | 3/2010 | Akimoto et al. | |
| 7,732,819 B2 | 6/2010 | Akimoto et al. | |
| 8,344,788 B2 | 1/2013 | Yamazaki et al. | |
| 8,598,586 B2 | 12/2013 | Isa et al. | |
| 8,723,173 B2* | 5/2014 | Yamazaki | H01L 29/42384 257/43 |
| 8,823,439 B2 | 9/2014 | Yamazaki et al. | |
| 8,872,179 B2 | 10/2014 | Tsubuku | |
| 8,999,751 B2 | 4/2015 | Yamazaki et al. | |
| 9,006,728 B2 | 4/2015 | Yamazaki et al. | |
| 9,093,543 B2 | 7/2015 | Tsubuku | |
| 9,136,391 B2 | 9/2015 | Yamazaki et al. | |
| 9,349,791 B2 | 5/2016 | Yamazaki et al. | |
| 9,583,516 B2 | 2/2017 | Yamazaki et al. | |
| 9,865,744 B2 | 1/2018 | Yamazaki et al. | |
| 9,905,627 B2* | 2/2018 | Seol | H01L 29/66969 |
| 9,941,413 B2 | 4/2018 | Yamazaki et al. | |
| 10,014,334 B2* | 7/2018 | Ikeda | H01L 27/1214 |
| 10,043,833 B2 | 8/2018 | Yoneda et al. | |
| 10,529,740 B2* | 1/2020 | Matsukura | H01L 29/78648 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0111691 A1 | 6/2003 | So | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0275038 A1 | 12/2005 | Shih et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1* | 2/2007 | Shin | H01L 51/5281 313/504 |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0012940 A1 | 1/2010 | Sato | |
| 2010/0065844 A1 | 3/2010 | Tokunaga | |
| 2010/0092800 A1 | 4/2010 | Itagaki et al. | |
| 2010/0102313 A1 | 4/2010 | Miyairi et al. | |
| 2010/0109002 A1 | 5/2010 | Itagaki et al. | |
| 2010/0148825 A1 | 6/2010 | Park et al. | |
| 2010/0289997 A1 | 11/2010 | Suzuki | |
| 2011/0024755 A1* | 2/2011 | Korenari | H01L 29/78696 257/59 |
| 2011/0079784 A1 | 4/2011 | Im | |
| 2011/0084263 A1* | 4/2011 | Yamazaki | H01L 29/66477 257/43 |
| 2011/0084278 A1 | 4/2011 | Cho et al. | |
| 2011/0147754 A1* | 6/2011 | Isa | H01L 27/12 257/60 |
| 2011/0181349 A1 | 7/2011 | Yamazaki et al. | |
| 2011/0198484 A1* | 8/2011 | Kurokawa | G06K 9/0002 250/214 R |
| 2011/0284837 A1 | 11/2011 | Nishijima | |
| 2013/0134422 A1 | 5/2013 | Tsubuku | |
| 2013/0200366 A1 | 8/2013 | Koyama et al. | |
| 2013/0200367 A1 | 8/2013 | Yamazaki et al. | |
| 2013/0207101 A1* | 8/2013 | Yamazaki | H01L 29/41733 257/43 |
| 2013/0240872 A1* | 9/2013 | Noda | H01L 29/41733 257/43 |
| 2014/0319498 A1* | 10/2014 | Lee | H01L 29/41733 257/40 |
| 2015/0001532 A1* | 1/2015 | Yamazaki | H01L 29/78645 257/43 |
| 2015/0034945 A1* | 2/2015 | Sakakura | H01L 29/7869 257/43 |
| 2015/0372146 A1* | 12/2015 | Shishido | H01L 29/7869 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| | | | |
|---|---|---|---|
| JP | 63-215519 A | 9/1988 | |
| JP | 63-239117 A | 10/1988 | |
| JP | 63-265818 A | 11/1988 | |
| JP | 02-245741 A | 10/1990 | |
| JP | 05-251705 A | 9/1993 | |
| JP | 08-264794 A | 10/1996 | |
| JP | 11-505377 | 5/1999 | |
| JP | 11-283934 A | 10/1999 | |
| JP | 2000-044236 A | 2/2000 | |
| JP | 2000-150900 A | 5/2000 | |
| JP | 2002-023697 A | 1/2002 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006-286772 A | 10/2006 | |
| JP | 2007-005585 A | 1/2007 | |
| JP | 2008-288269 A | 11/2008 | |
| JP | 2010-123925 | * 6/2010 | ........... H01L 29/768 |
| JP | 2010-123925 A | 6/2010 | |
| JP | 2010-251735 A | 11/2010 | |
| JP | 2011-082487 A | 4/2011 | |
| JP | 2011-100992 A | 5/2011 | |
| JP | 2011-151380 A | 8/2011 | |
| JP | 2011-172217 A | 9/2011 | |
| JP | 2011-181913 A | 9/2011 | |
| JP | 2013-138185 A | 7/2013 | |
| KR | 2014-0129686 A | 11/2014 | |
| WO | WO-2004/114391 | 12/2004 | |
| WO | WO-2009/093602 | 7/2009 | |
| WO | WO-2011/043170 | 4/2011 | |
| WO | WO-2011/089841 | 7/2011 | |

OTHER PUBLICATIONS

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO(ZnO)3$, and $Ga_2O_3(ZnO)m$ (m = 7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World'S Largest (15-Inch) XGA AMLCD Panel Using Igzo Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SiD International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission Amoled Display on Plastic Film and Its Bending Properties", SID Digest '09 : SID International Symposium Digest of Technical Papers, May 31, 2009, pp. 983-985.

Sakata.J et al., "Development of 4.0-in. AMOLED Display With Driver Circuit Using Amorphous In—Ga—Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZNO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 in. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter; Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International-Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B): 2008, vol. 77, pp. 245262-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

\* cited by examiner 31  45  65  42  21  41

31  45  65  42  21  41

SEMICONDUCTOR DEVICE

BACKGROUND OF THE INVENTION

1. Field of the Invention

The technical field relates to a semiconductor device.

2. Description of the Related Art

Patent Document 1 discloses parallel connection of a first transistor and a second transistor.

Each of Patent Document 2 and Patent Document 3 discloses a transistor including an oxide semiconductor layer between two gate electrodes.

REFERENCE

Patent Document

[Patent Document 1] Japanese Published Patent Application No. 2002-023697
[Patent Document 2] Japanese Published Patent Application No. 2010-251735
[Patent Document 3] Japanese Published Patent Application No. 2011-181913

SUMMARY OF THE INVENTION

An object is to solve at least one problem selected from a first problem, a second problem, a third problem, and a fourth problem.
<First Problem>
With the parallel connection of the first transistor and the second transistor, the number of the oxide semiconductor layers is increased.
<Second Problem>
The parasitic capacitance effects on the driving of the transistor.
<Third Problem>
A novel semiconductor device is required.
<Fourth Problem>
The fourth problem is at least one problem selected from a plurality of problems apparent from this specification.

The number of oxide semiconductor layers can be reduced when one oxide semiconductor layer has a first channel formation region and a second channel formation region.

One of two conductive layers has an opening.

When the other of the two conductive layers has a region overlapping with the opening, the parasitic capacitance is low.
<Opening>
For example, the opening is a missing part.
For example, the opening is a hole.
For example, an opening 45 shown in FIG. 3A is a missing part.
For example, the opening 45 shower FIG. 3B is a hole.
For example, an opening 75 shown in FIG. 4A is a missing part.
For example, the opening 75 shown in FIG. 4B is a hole.
For example, the missing part can be referred to as a gap.
For example, a linear shape of an edge of the missing part is an opened shape.
A linear shape of an edge of the hole is a closed shape.

<Example of Disclosed Invention>
The semiconductor device includes a first conductive layer.

The semiconductor device includes a first insulating layer over the first conductor layer.

The semiconductor device includes an oxide semiconductor layer over the first insulating layer.

The semiconductor device includes a second conductive layer over the oxide semiconductor layer.

The semiconductor device includes a third conductive layer over the oxide semiconductor layer.

The semiconductor device includes a second insulating layer over the second conductive layer and the third conductive layer.

The semiconductor device includes a fourth conductive layer over the second insulating layer.

The semiconductor device includes a fifth conductive layer over the second insulating layer.

The semiconductor device includes a third insulating layer over the fourth conductive layer and the fifth conductive layer.

The semiconductor device includes a sixth conductive layer over the third insulating layer.

The oxide semiconductor layer as a first channel formation region of a first transistor.

The oxide semiconductor layer has a second channel formation region of a second transistor.

The first conductive layer has a function of a first gate electrode of the first transistor.

The first conductive layer has a function of a second gate electrode of the second transistor.

The second conductive layer has a function of one of a source electrode and a drain electrode of the first transistor.

The second conductive layer has a function of one of a source electrode and a drain electrode of the second transistor.

The third conductive layer has a function of the other of the source electrode and the drain electrode of the first transistor.

The third conductive layer has a function of the other of the source electrode and the drain electrode of the second transistor.

The fourth conductive layer has a function of a third gate electrode of the first transistor.

The fourth conductive layer has a function of a fourth gate electrode of the second transistor.

The second conductive layer has a first opening.
The fourth conductive layer has a second opening.
The third conductive layer has a region overlapping with the first opening and a region overlapping with the second opening.

The sixth conductive layer is electrically connected to the third conductive layer with the fifth conductive layer.

The fifth conductive layer has a region overlapping with the first opening and a region overlapping with the second opening.
<Fifth Conductive Layer, Sixth Conductive Layer>
When the sixth conductive layer is formed over the third insulating layer, the degree of freedom of shape of the sixth conductive layer can be high.

For example, the sixth conductive layer is a pixel electrode.

The sixth conductive layer is electrically connected to the fourth conductive layer with the fifth conductive layer.

With the fifth conductive layer, the probability of disconnection of the sixth conductive layer can be decreased.

The number of oxide semiconductor layers is decreased.

The parasitic capacitance is low.

A novel semiconductor device is provided.

The problems apparent from the content of this specification can be solved.

DETAILED DESCRIPTION OF THE INVENTION

Figure 1:
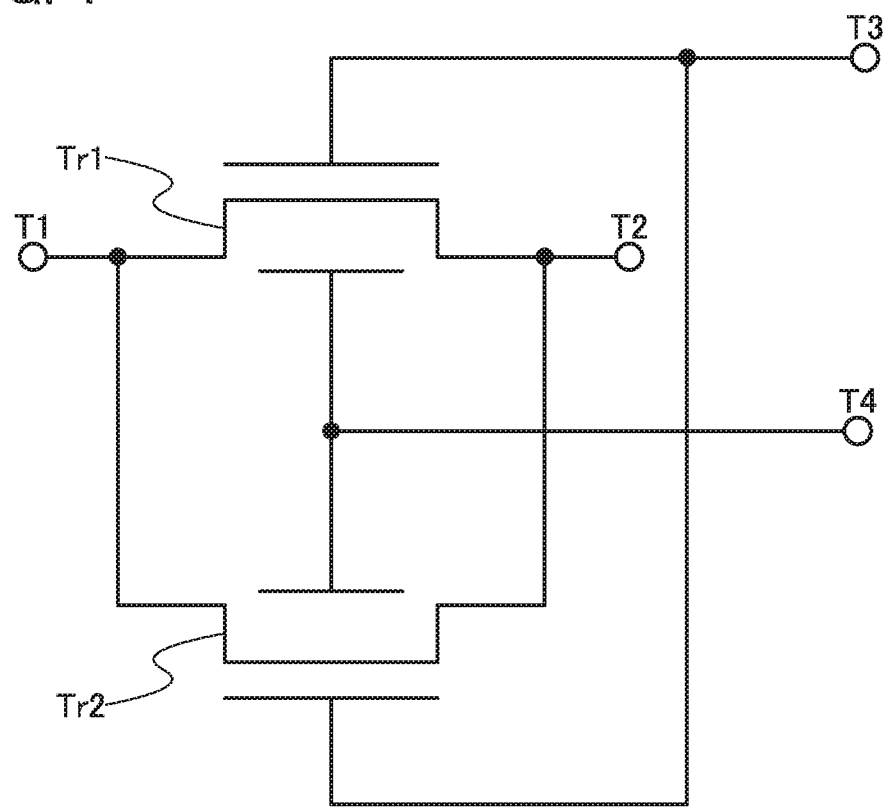
FIG. 1 shows an example of a semiconductor device.

Embodiments will be described with drawings.

Contents described in the embodiments are each just one example.

The interpretation of the invention should not be limited to only the contents of the embodiments.

In the embodiments, portions shown by the same reference numerals are not explained repeatedly.

In the drawings, the same reference numeral may be used in the same part.

In the drawings, the same hatching may be used in the same part.

In the drawings, the same reference numeral may be used in the similar part.

In the drawings, the same hatching may be used in the similar part.

The contents of the embodiment can be combined with the contents of the other embodiment.

Embodiment 1

An example of the semiconductor device can be described with reference to FIG. 1 and FIG. 2.

<Example of Circuit>

FIG. 1 shows that a transistor Tr1 and a transistor Tr2 are connected in parallel.

A terminal T1 is electrically connected to one of a source electrode and a drain electrode of the transistor Tr1.

The terminal T1 is electrically connected to one of a source electrode and a drain electrode of the transistor Tr2.

The one of the source electrode and the drain electrode of the transistor Tr1 is electrically connected to the one of the source electrode and the drain electrode of the transistor Tr2.

A terminal T2 is electrically connected to the other of the source electrode and the drain electrode of the transistor Tr1.

The terminal T2 is electrically connected to the other of the source electrode and the drain electrode of the transistor Tr2.

The other of the source electrode and the drain electrode of the transistor Tr1 is electrically connected to the other of the source electrode and the drain electrode of the transistor Tr2.

A terminal T3 is electrically connected to a first gate electrode of the transistor Tr1.

The terminal T3 is electrically connected to a second gate electrode of the transistor Tr2.

The first gate electrode of the transistor Tr1 is electrically connected to the second gate electrode of the transistor Tr2.

A terminal T4 is electrically connected to a third gate electrode of the transistor Tr1.

The terminal T4 is electrically connected to the fourth gate electrode of the transistor Tr2.

The third gate electrode of the transistor Tr1 is electrically connected to the fourth gate electrode of the transistor Tr2.

The terminal T1 is electrically connected to the terminal T2 through a first channel formation region of the transistor Tr1.

The terminal T1 is electrically connected to the terminal T2 through a second channel formation region of the transistor Tr2.

For example, the terminal T3 can be electrically connected to the terminal T4.

For example, the terminal T3 can be electrically isolated from the terminal T4.

<Cross-Sectional View>

An example of a semiconductor device is described with reference to FIG. 2.

There is a substrate 10.

A conductive layer 21 is placed over the substrate 10.

An insulating layer 30 is placed over the conductive layer 21.

An oxide semiconductor layer 31 is placed over the insulating layer 30.

A conductive layer 41 is placed over the oxide semiconductor layer 31.

A conductive layer 42 is placed over the oxide semiconductor layer 31.

For example, the conductive layer 41 and the conductive layer 42 can be formed through a step of etching one conductive layer.

An insulating layer 60 is placed over the conductive layer 41 and the conductive layer 42.

A conductive layer 71 is placed over the insulating layer 60.

A conductive layer 72 is formed over the insulating layer 60.

An insulating layer 80 is placed over the conductive layer 71 and the conductive layer 72.

A conductive layer 91 is placed over the insulating layer 80.

Figure 2:
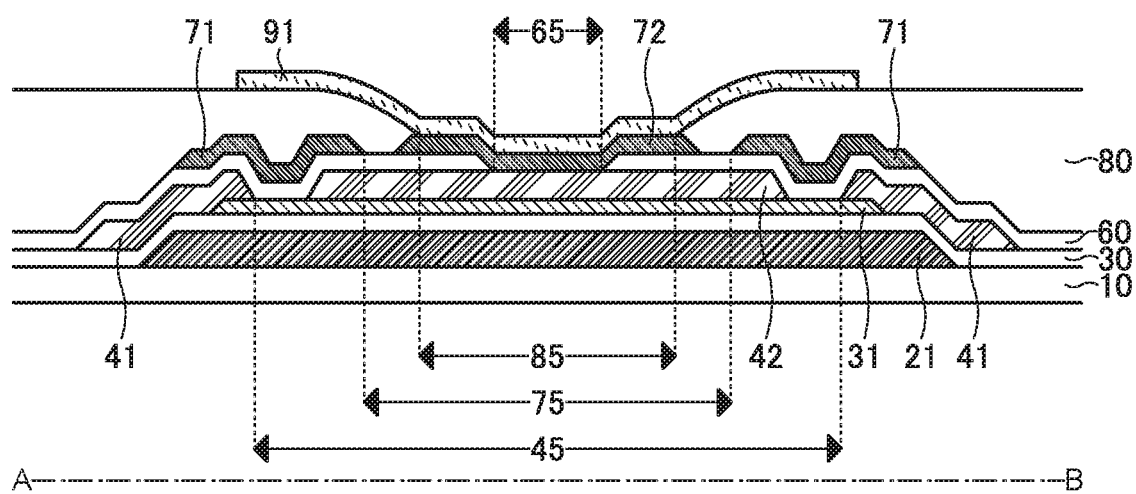
FIG. 2 shows an example of a semiconductor device.

For example, FIG. 2 corresponds to FIG. 1.

The conductive layer 21 has a region capable of functioning as the first gate electrode of the transistor Tr1.

The conductive layer 21 has a region capable of functioning as the second gate electrode of the transistor Tr2.

The insulating layer 30 has a region capable of functioning as a first gate insulating layer of the transistor Tr1.

The insulating layer 30 has a region capable of functioning as a second gate insulating layer of the transistor Tr2.

The oxide semiconductor layer 31 has a region overlapping with the conductive layer 21.

The oxide semiconductor layer 31 has the first channel formation region of the transistor Tr1.

The oxide semiconductor layer 31 has a second channel formation region of the transistor Tr2.

In the transistor Tr1, the first gate insulating layer is placed between the first gate electrode and the first channel formation region.

In the transistor Tr2, the second gate insulating layer is placed between the second gate electrode and the second channel formation region.

The conductive layer 41 has a region overlapping with the oxide semiconductor layer 31.

The conductive layer 42 has a region overlapping with the oxide semiconductor layer 31.

The conductive layer 41 has a region capable of functioning as one of the source electrode and the drain electrode of the transistor Tr1.

The conductive layer 41 has a region capable of functioning as one of the source electrode and the drain electrode of the transistor Tr2.

The conductive layer 41 has an opening 45 between the "region capable of functioning as one of the source electrode and the drain electrode of the transistor Tr1" and the "region capable of functioning as one of the source electrode and the drain electrode of the transistor Tr2".

The conductive layer 42 has a region overlapping with the opening 45.

The conductive layer 42 has a region capable of functioning as the other of the source electrode and the drain electrode of the transistor Tr1.

The conductive layer 42 has a region capable of functioning as the other f the source electrode and the drain electrode of the transistor Tr2.

The insulating layer 60 has a region capable of functioning as a third gate insulating layer of the transistor Tr1.

The insulating layer 60 has a region capable of functioning as a fourth gate insulating layer of the transistor Tr2.

The insulating layer 60 has an opening 65.

The conductive layer 71 has a region overlapping with the oxide semiconductor layer 31.

The conductive layer 71 has a region overlapping with the conductive layer 41.

The conductive layer 71 has a region overlapping with the conductive layer 42.

The conductive layer 71 has a region capable of functioning as the third gate electrode of the transistor Tr1.

The conductive layer 71 has a region capable of functioning as the fourth gate electrode of the transistor Tr2.

The conductive layer 71 has an opening 75 between the "region capable of functioning as the third gate electrode of the transistor Tr1" and the "region capable of functioning as the fourth gate electrode of the transistor Tr2".

The conductive layer 72 has a region overlapping with the opening 75.

The conductive layer 72 is electrically connected to the conductive layer 42 through the opening 65.

The insulating layer 80 has an opening 85.

The conductive layer 91 is electrically connected to the conductive layer 72 through the opening 85.

For example, the conductive layer 91 has a region capable of a function of an electrode or a wiring.

For example, the electrode is a pixel electrode.

<Conductive Layer 21, Conductive Layer 71>

The conductive layer 21 can be electrically connected to the conductive layer 71.

The conductive layer 21 can be electrically isolated from the conductive layer 71.

<Top-Gate Transistor>

A top-gate transistor can be employed.

For example, formation of the conductive layer 21 and the insulating layer 30 can be skipped.

For example, the conductive layer 21 can be in a floating state.

The conductive layer 21 in a floating state has a function of blocking impurities from the substrate 10.

<Example>

For example, a structure without the opening 65 can be employed.

For example, formation of the conductive layer 72 can be skipped.

For example, a structure without the opening 75 can be employed.

For example, formation of the insulating layer 80 can be skipped.

For example, formation of the conductive layer 91 can be skipped.

<Number of Oxide Semiconductor Layers>

When the oxide semiconductor layer 31 has the first channel formation region and the second channel formation region, the number of oxide semiconductor layers can be small.

<Parasitic Capacitance>

For example, a structure without the opening 75 can be employed.

Without the opening 75, the amount of parasitic capacitance between the conductive layer 42 and the conductive layer 71 is increased.

In FIG. 2, the conductive layer 42 has a region overlapping with the opening 75, whereby the amount of parasitic capacitance between the conductive layer 42 and the conductive layer 71 can be decreased.

<Degree of Freedom>

When the conductive layer 91 is formed over the insulating layer 80, the degree of freedom of shape of the conductive layer 91 can be high.

<Disconnection>

When the conductive layer is in contact with two surfaces, the distance between the two surfaces is reduced, so that the probability of disconnection of the conductive layer can be decreased.

For example, formation of the conductive layer 72 can be skipped.

Without the conductive layer 72, the conductive layer 91 is in contact with a surface of the insulating layer 60 and a surface of the insulating layer 80.

When the conductive layer 72 is formed as illustrated in FIG. 2, the conductive layer 91 is in contact with a surface of the conductive layer 72 and the surface of the insulating layer 80.

The "distance between the surface of the conductive layer 72 and the surface of the insulating layer 80" is shorter than the "distance between the surface of the insulating layer 60 and the surface of the insulating layer 80".

With the conductive layer 72, the probability of disconnection of the conductive layer 91 can be decreased.

Embodiment 2

An example of a semiconductor device is described with reference to FIG. 2, FIGS. 3A and 3B, FIGS. 4A and 4B, FIGS. 5A and 5B, and FIG. 6.

<Outline>

Figure 6:
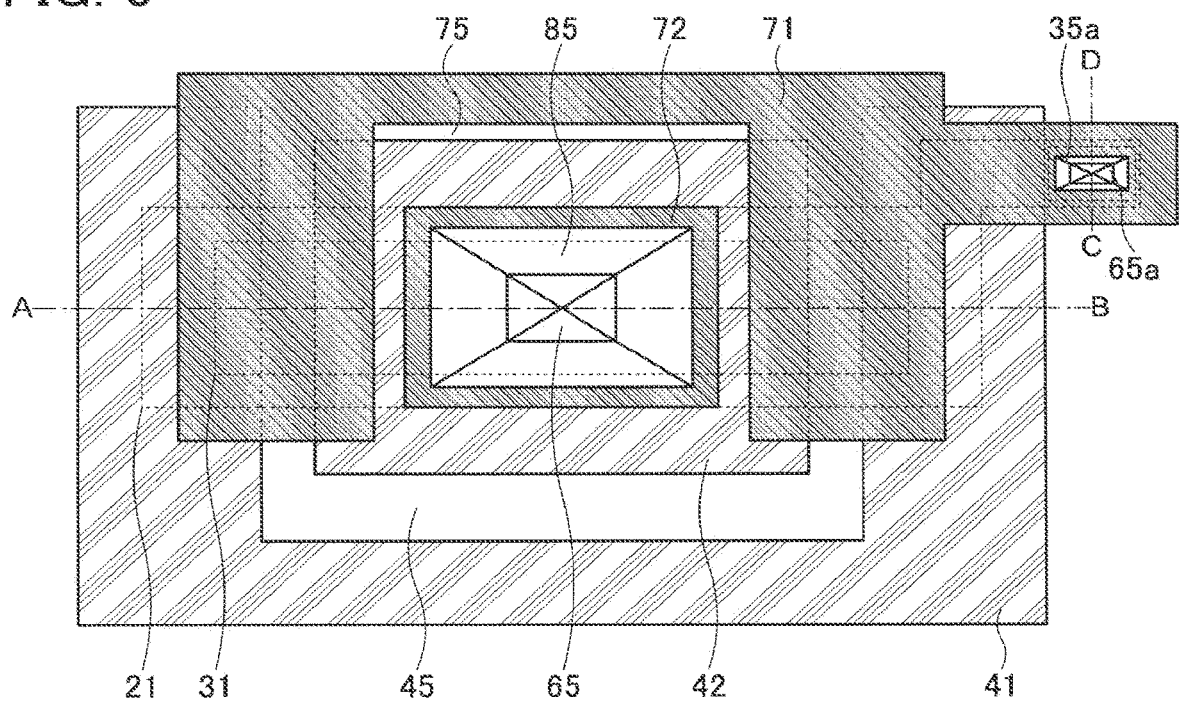
FIG. 6 shows an example of a semiconductor device.

An example of a cross section along A-B in FIG. 6 is shown in FIG. 2.

Figure 3A:
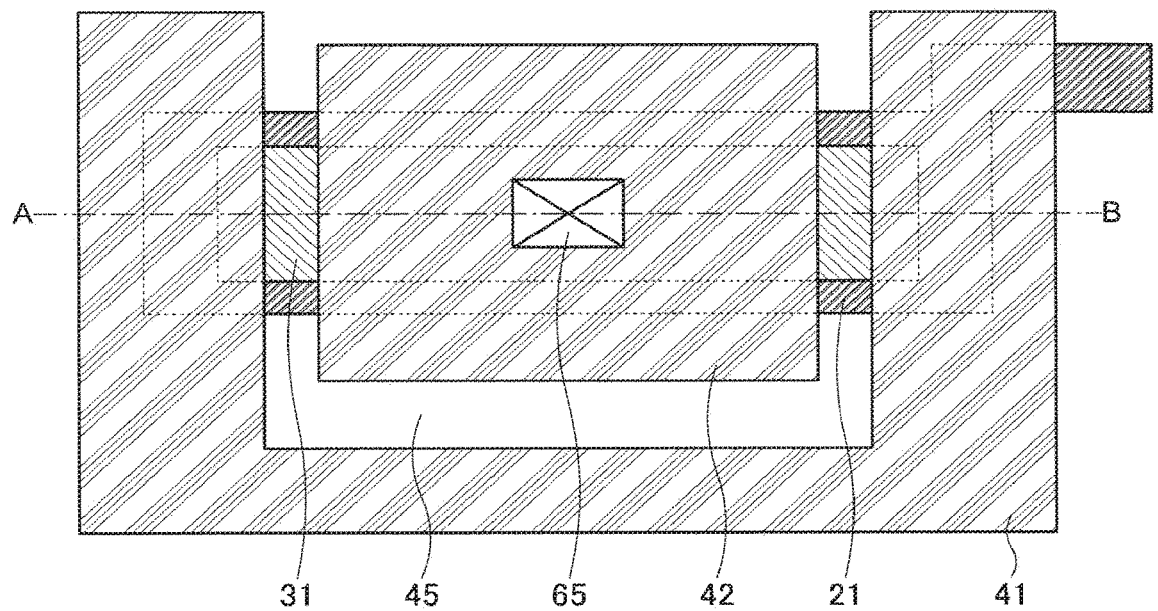
FIGS. 3A and 3B each show an example of a semiconductor device.
Figure 4A:
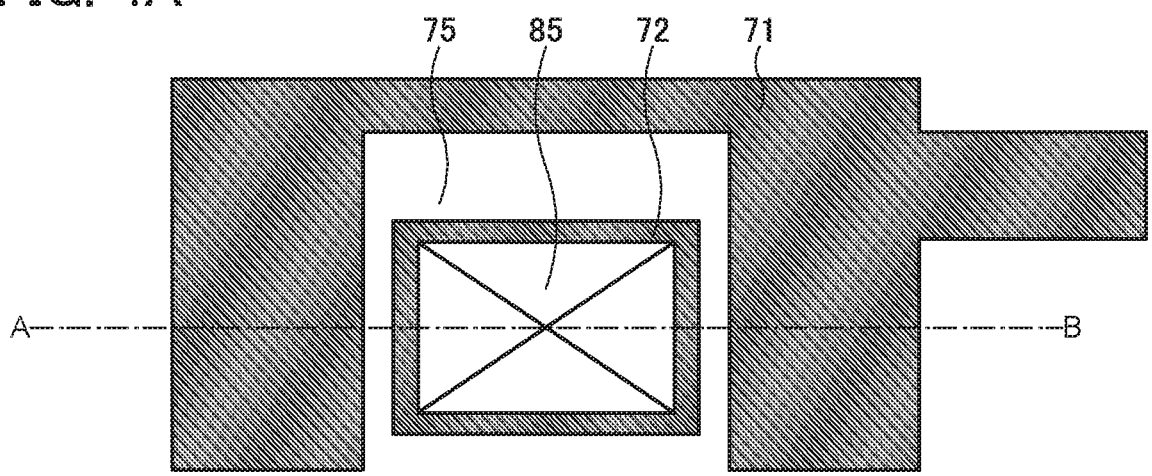
FIGS. 4A and 4B each show an example of a semiconductor device.
Figure 5A:
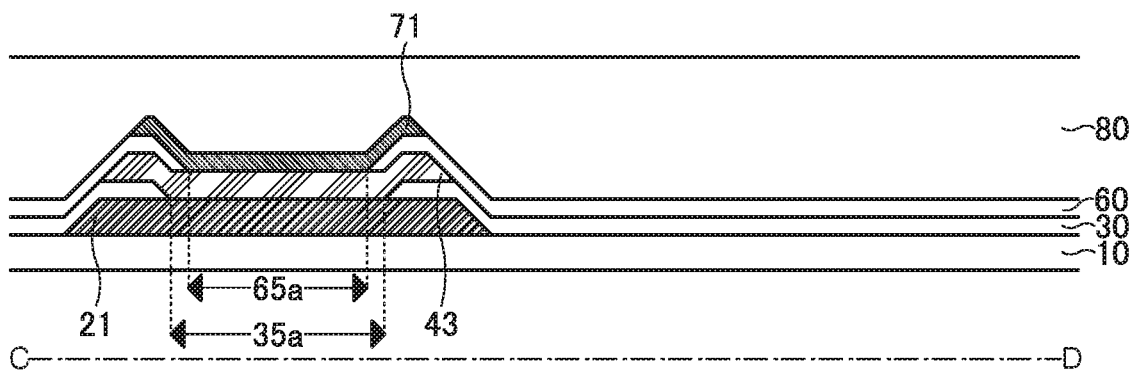
FIGS. 5A and 5B each show an example of a semiconductor device.

FIG. 6 shows an example obtained by combining FIG. 3A, FIG. 4A, and FIG. 5A.

Figure 3B:
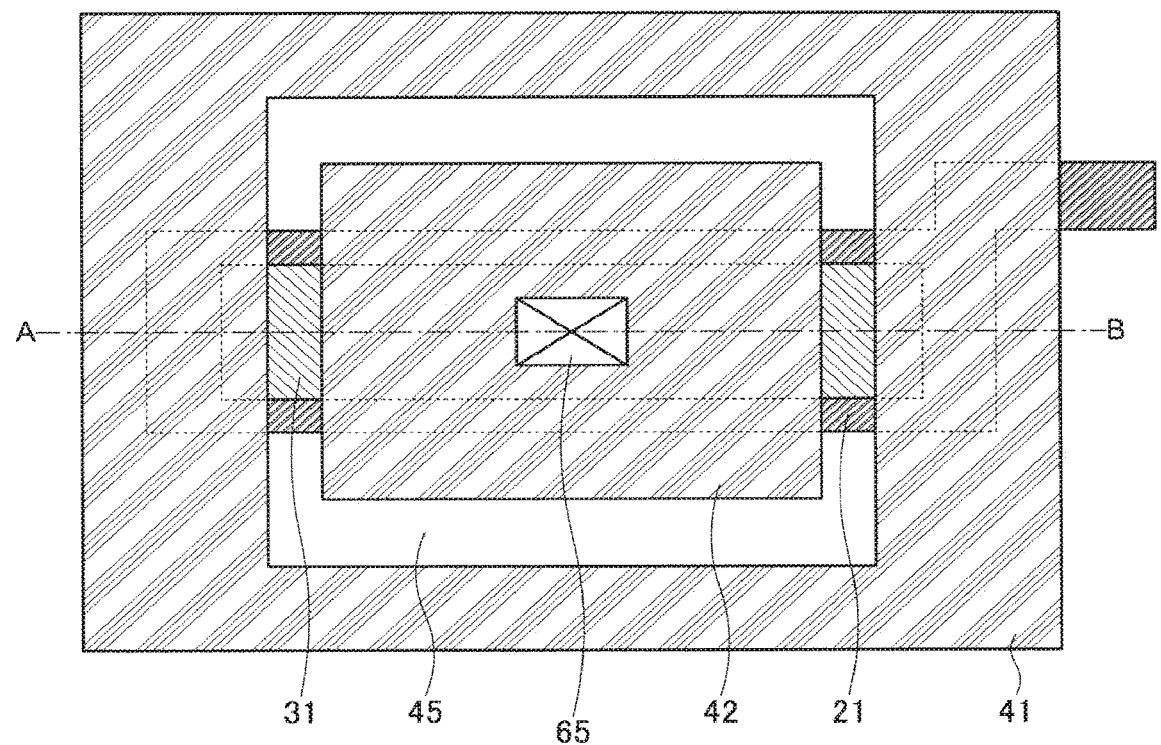

A structure shown in FIG. 3B can be employed instead of that in FIG. 3A.

Figure 4B:
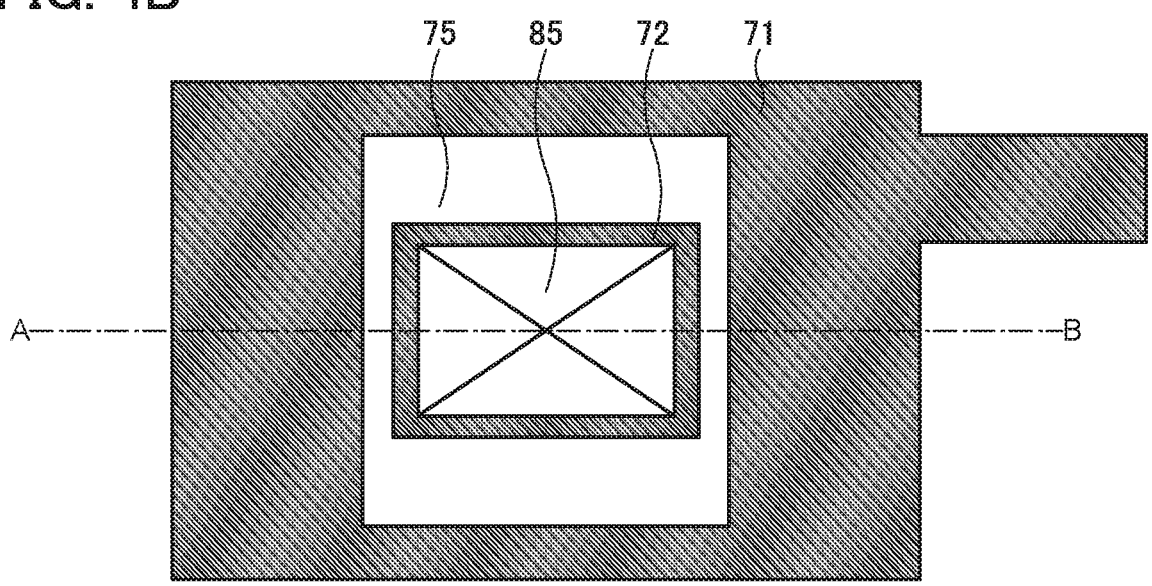

A structure shown in FIG. 4B can be employed instead of that in FIG. 4A.

Figure 5B:
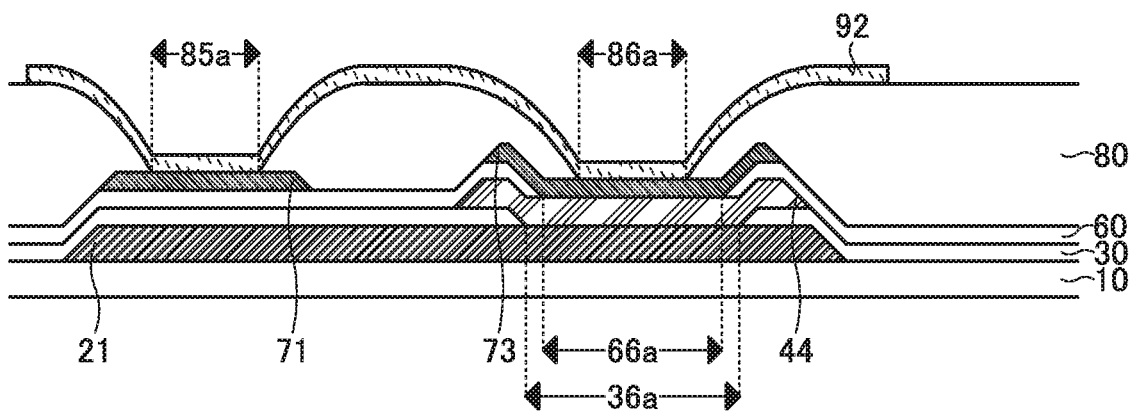

A structure shown in FIG. 5B can be employed instead of that in FIG. 5A.

<1. Cross-Sectional View>

An example of a cross section along C-D in FIG. 6 is shown in FIG. 5A.

A conductive layer 43 is placed over the insulating layer 30.

For example, the conductive layer 41, the conductive layer 42, and the conductive layer 43 can be formed through a step of etching one conductive layer.

The insulating layer 30 has an opening 35a.

The insulating layer 60 has an opening 65a.

The conductive layer 71 is electrically connected to the conductive layer 43 through the opening 65a.

The conductive layer 43 is electrically connected to the conductive layer 21 through the opening 35a.

The conductive layer 71 is electrically connected to the conductive layer 21.

With the conductive layer 43, the probability of disconnection of the conductive layer 71 can be reduced.

The conductive layer 71 can be electrically isolated from the conductive layer 21.

A structure without the conductive layer 43 can be employed.

<2. Cross-Sectional View>

For example, the structure shown in FIG. 5B can be employed instead of that in FIG. 5A.

A conductive layer 44 is placed over the insulating layer 30.

For example, the conductive layer 41, the conductive layer 42, and the conductive layer 44 can be formed through a step of etching one conductive layer.

A conductive layer 73 is placed over the insulating layer 60.

For example, the conductive layer 71, the conductive layer 72, and the conductive layer 73 can be formed through a step of etching one conductive layer.

A conductive layer 92 is placed over the insulating layer 80.

For example, the conductive layer 91 and the conductive layer 92 can be formed through a step of etching one conductive layer.

The insulating layer 30 has an opening 36a.

The insulating layer 60 has an opening 66a.

The insulating layer 80 has an opening 85a.

The insulating layer 80 has an opening 86a.

The conductive layer 92 is electrically connected to the conductive layer 71 through the opening 85a.

The conductive layer 92 is electrically connected to the conductive layer 73 through the opening 86a.

The conductive layer 73 is electrically connected to the conductive layer 44 through the opening 66a.

The conductive layer 44 is electrically connected to the conductive layer 21 through the opening 36a.

With the conductive layer 44, the probability of disconnection of the conductive layer 73 or the conductive layer 92 can be reduced.

With the conductive layer 73, the probability of disconnection of the conductive layer 92 can be reduced.

Formation of the conductive layer 44 can be skipped.

Formation of the conductive layer 73 can be skipped.

<Opening>

For example, the opening 45 shown in FIG. 3A and FIG. 6 is a missing part.

For example, the opening 45 shown FIG. 3B is a hole.

For example, the opening 75 shown in FIG. 4A and FIG. 6 is a missing part.

For example, the opening 75 shown in FIG. 4B is a hole.

For example, the opening 65 shown in FIGS. 3A and 3B and FIG. 6 is a hole.

For example, the opening 85 shown in FIGS. 4A and 4B and FIG. 6 is a hole.

For example, the opening 35a shown in FIG. 5A and FIG. 6 is a hole.

For example, the opening 36a shown in FIG. 5B is a hole.

For example, the opening 85a shown in FIG. 5B is a hole.

For example, the opening 86a shown in FIG. 5B is a hole.

The opening can be a missing part instead of a hole.

The opening can be a hole instead of a missing part.

Note that this embodiment can be applied to Embodiment 1.

Embodiment 3

Figure 7A:
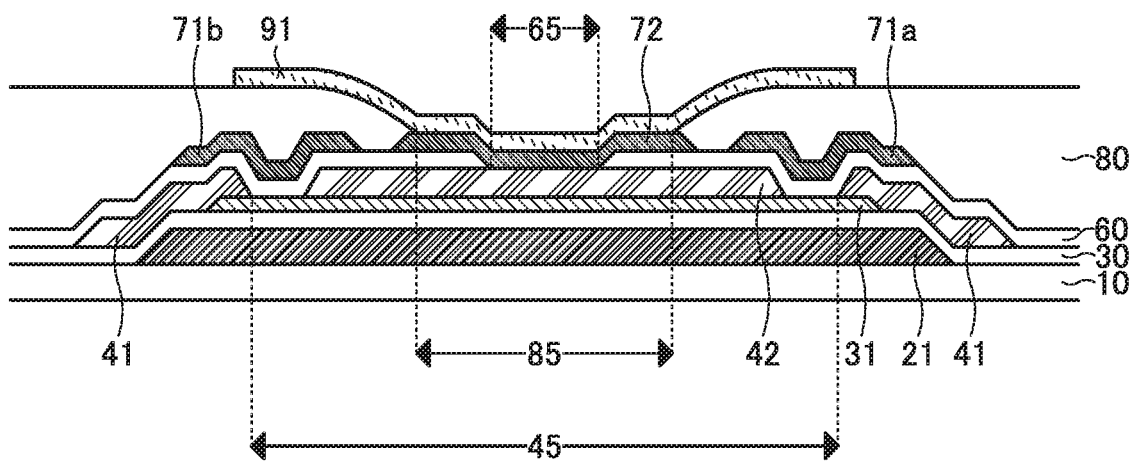
FIGS. 7A to 7C each show an example of a semiconductor device.
Figure 7B:
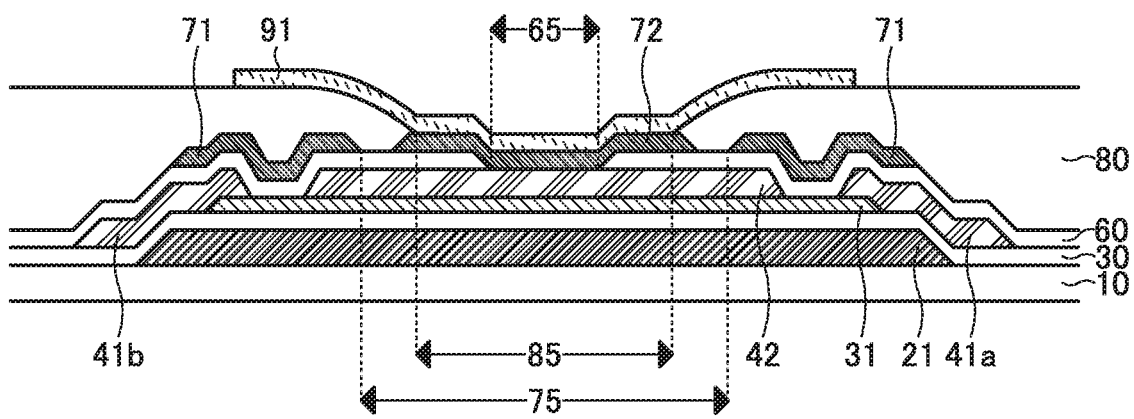
Figure 7C:
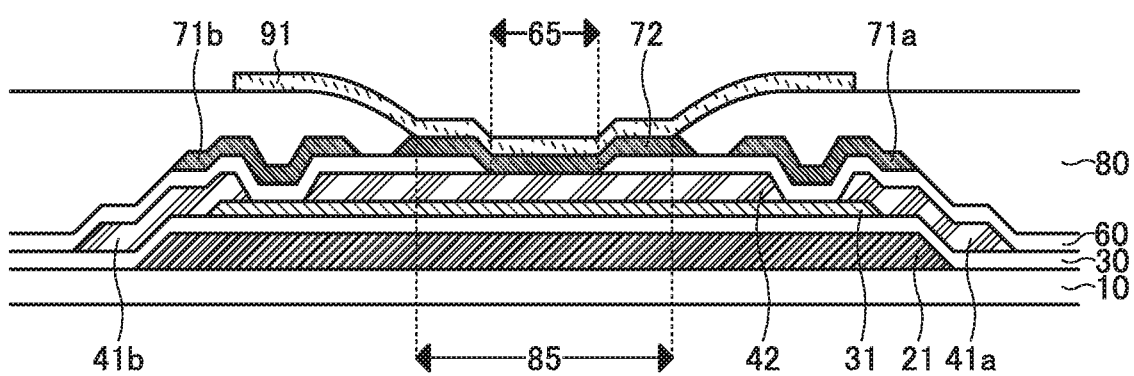

For example, as illustrated in FIGS. 7A and 7C, the conductive layer 71 can be divided into a conductive layer 71a and a conductive layer 71b.

For example, as illustrated in FIGS. 7B and 7C, the conductive layer 41 can be divided into the conductive layer 41a and the conductive layer 41b.

The conductive layer 71a is electrically connected to the conductive layer 71b.

The conductive layer 41a is electrically connected to the conductive layer 41b.

For example, the conductive layer 71a has a region capable of functioning as the third gate electrode of the transistor Tr1 in FIG. 1.

For example, the conductive layer 71b has a region capable of functioning as the fourth gate electrode of the transistor Tr2 in FIG. 1.

For example, the conductive layer 41a has a region capable of functioning as one of the source electrode and the drain electrode of the transistor Tr1 in FIG. 1.

For example, the conductive layer 41b has a region capable of functioning as one of the source electrode and the drain electrode of the transistor Tr2 in FIG. 1.

<Conductive Layer 21, Conductive Layer 71a, Conductive Layer 71b>

In FIGS. 7A to 7C, FIGS. 8A to 8C, and FIGS. 9A and 9B, the conductive layer 21 has a region capable of functioning as the first gate electrode of the transistor Tr1.

In FIGS. 7A to 7C, FIGS. 8A to 8C, and FIGS. 9A and 9B, the conductive layer 21 has a region capable of functioning as the second gate electrode of the transistor Tr2.

Figure 8A:
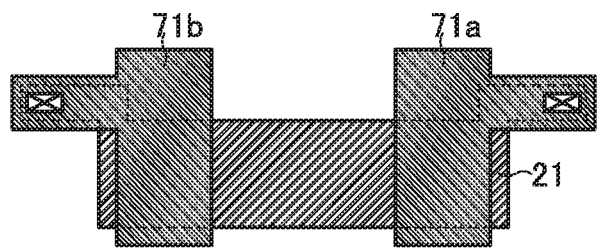
FIGS. 8A to 8C each show an example of a semiconductor device.

For example, as illustrated in FIG. 8A, the conductive layer 71a and the conductive layer 71b can be electrically connected to each other with the conductive layer 21.

In FIG. 8A, the conductive layer 21, the conductive layer 71a, and the conductive layer 71b are electrically connected to each other.

Figure 8B:
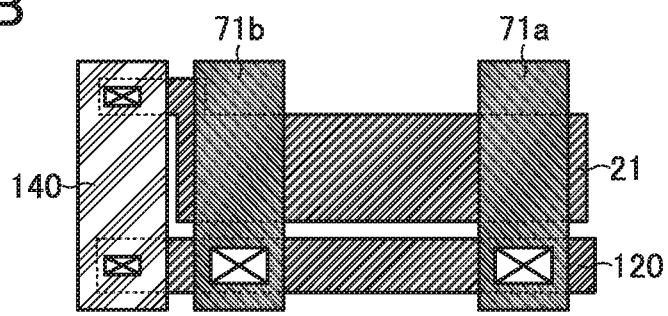

For example, as illustrated in FIG. 8B, the conductive layer 71a and the conductive layer 71b can be electrically connected to each other with a conductive layer 120.

For example, as illustrated in FIG. 8B, the conductive layer 120 can be electrically connected to the conductive layer 21 with a conductive layer 140.

In FIG. 8B, the conductive layer 21, the conductive layer 71a, the conductive layer 71b, and the conductive layer 120, and the conductive layer 140 are electrically connected to each other.

Figure 8C:
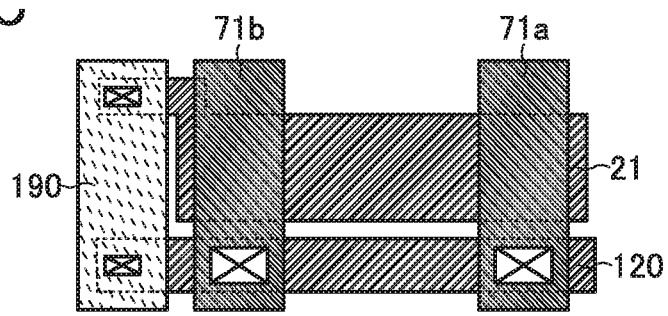

For example, as illustrated in FIG. 8C, the conductive layer 71a can be electrically connected to the conductive layer 71b with the conductive layer 120.

For example, as illustrated in FIG. 8C, the conductive layer 120 can be electrically connected to the conductive layer 21 with a conductive layer 190.

In FIG. 8C, the conductive layer 21, the conductive layer 71a, the conductive layer 71b, the conductive layer 120, and the conductive layer 190 are electrically connected to each other.

Figure 9A:
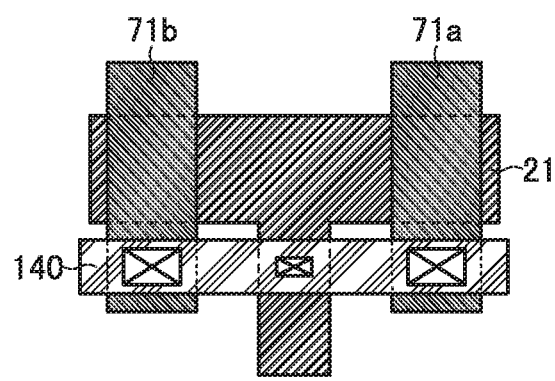
FIGS. 9A and 9B each show an example of a semiconductor device.

For example, as illustrated in FIG. 9A, the conductive layer 71a can be electrically connected to the conductive layer 71b with the conductive layer 140.

For example, as illustrated in FIG. 9A, the conductive layer 21 can be electrically connected to the conductive layer 71a and the conductive layer 71b with the conductive layer 140.

Figure 9B:
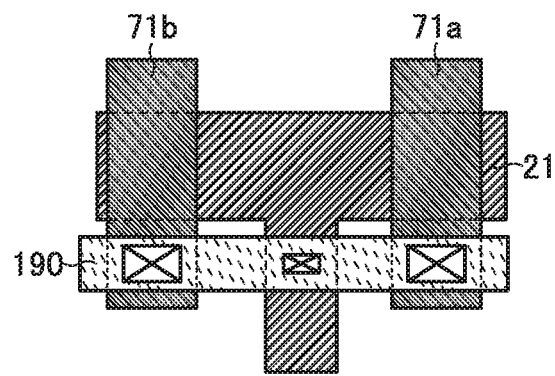

For example, as illustrated in FIG. 9B, the conductive layer 71a can be electrically connected to the conductive layer 71b with the conductive layer 190.

For example, as illustrated in FIG. 9B, the conductive layer 21 can be electrically connected to the conductive layer 71a and the conductive layer 71b with the conductive layer 190.

For example, the conductive layer 21 and the conductive layer 120 can be formed through a step of etching one conductive layer.

For example, the conductive layer 42 and the conductive layer 140 can be formed through a step of etching one conductive layer.

For example, the conductive layer 91 and the conductive layer 190 can be formed through a step of etching one conductive layer.

For example, as illustrated in FIG. 9A, the conductive layer 21 can intersect with the conductive layer 140.

In FIG. 9A, at a region where the conductive layer 21 and the conductive layer 140 intersect with each other, the conductive layer 140 is electrically connected to the conductive layer 21.

In FIG. 9A, the region where the conductive layer 21 and the conductive layer 140 intersect with each other is placed between the conductive layer 71a and the conductive layer 71b.

For example, as illustrated in FIG. 9B, the conductive layer 21 can intersect with the conductive layer 190.

In FIG. 9B, at a region where the conductive layer 21 and the conductive layer 190 intersect with each other, the conductive layer 190 is electrically connected to the conductive layer 21.

In FIG. 9B, the region where the conductive layer 21 and the conductive layer 190 intersect with each other is placed between the conductive layer 71a and the conductive layer 71b.

A layout shown in FIG. 8A is simpler than those in FIGS. 8B and 8C.

Layouts shown in FIGS. 9A and 9B are simpler than those in FIGS. 8B and 8C.

<Conductive Layer 41a, Conductive Layer 41b, Conductive Layer 42>

Figure 10A:
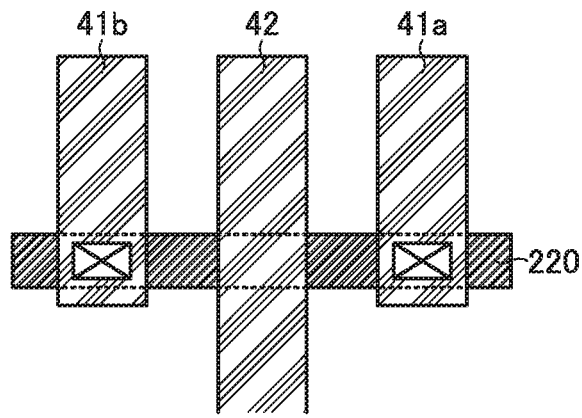
FIGS. 10A to 10C each show an example of a semiconductor device.
Figure 10B:
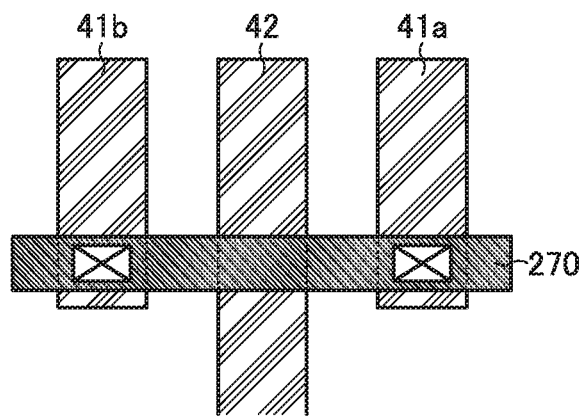
Figure 10C:
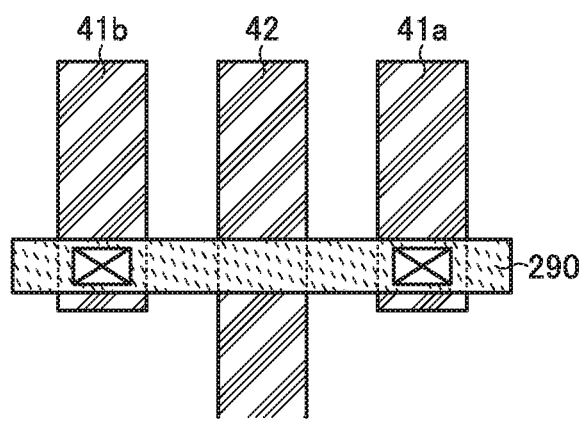

In FIGS. 10A to 10C, the conductive layer 42 has a region capable of functioning as the other of the source electrode and the drain electrode of the transistor Tr1 in FIG. 1.

In FIGS. 10A to 10C, the conductive layer 42 has a region capable of functioning as the other of the source electrode and the drain electrode of the transistor Tr2 in FIG. 1.

For example, as illustrated in FIG. 10A, the conductive layer 41a can be electrically connected to the conductive layer 41b with a conductive layer 220.

For example, as illustrated in FIG. 10B, the conductive layer 41a be electrically connected to the conductive layer 41b with a conductive layer 270.

For example, as illustrated in FIG. 10C, the conductive layer 41a can be electrically connected to the conductive layer 41b with a conductive layer 290.

In FIG. 10A, a region where the conductive layer 42 and the conductive layer 220 intersect with each other is placed between the conductive layer 41a and the conductive layer 41b.

In FIG. 10B, a region where the conductive layer 42 and the conductive layer 270 intersect with each other is placed between the conductive layer 41a and the conductive layer 41b.

In FIG. 10C, a region where the conductive layer 42 and the conductive layer 290 intersect with each other is placed between the conductive layer 41a and the conductive layer 41b.

For example, the conductive layer 21 and the conductive layer 220 can be formed through a step of etching one conductive layer.

For example, the conductive layer 72 and the conductive layer 270 can be formed through a step of etching one conductive layer.

For example, the conductive layer 91 and the conductive layer 290 can be formed through a step of etching one conductive layer.

The concept of each of structures shown in FIGS. 10A to 10C is to increase the degree of shape of the conductive layer 42.

For example, in FIGS. 3A and 3B, the conductive layer 42 cannot intersect with the conductive layer 41.

For example, in FIG. 10A, the conductive layer 42 can intersect with the conductive layer 220.

For example, in FIG. 10B, the conductive layer 42 can intersect with the conductive layer 270.

For example, in FIG. 10C, the conductive layer 42 can intersect with the conductive layer 290.

This embodiment can be applied to Embodiment 1 and Embodiment 2.

Embodiment 4

For formation of the opening 65, the surface of the conductive layer 42 can be removed.

Figure 11:
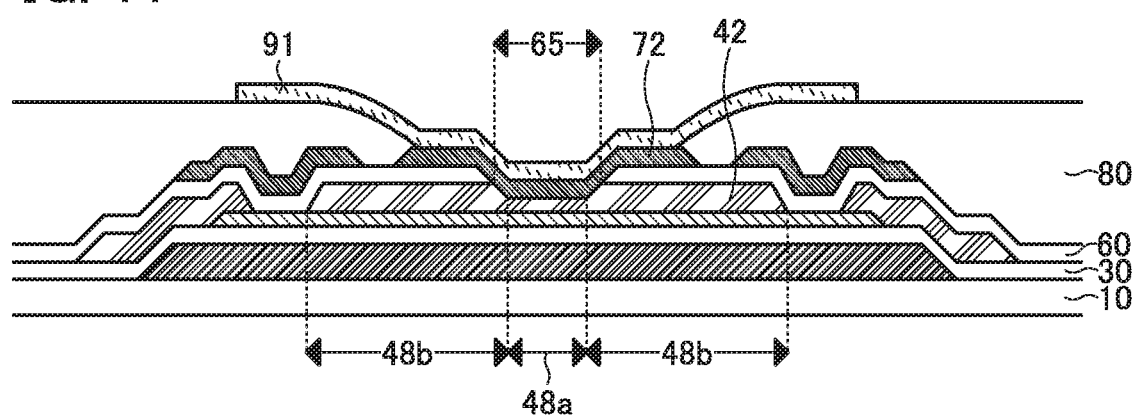
FIG. 11 shows an example of a semiconductor device.

For example, as illustrated in FIG. 11, the conductive layer 42 can have a region 48a thinner than a region 48b.

In FIG. 11, the region 48a is surrounded by the region 48b.

For example, the region 48a can also be referred to as a hollow.

For example, in FIG. 11, an edge of the hollow overlaps with the opening 65.

Since the conductive layer 42 has a hollow, an area where the conductive layer 42 and the conductive layer 72 are in contact with each other can be increased.

Without the conductive layer 72, an area where the conductive layer 42 and the conductive layer 91 are in contact with each other can be increased.

When an area where two conductive layers are in contact with each other is increased, the contact resistance by the two conductive layers can be decreased.

This embodiment can be applied to Embodiment 1 to Embodiment 3.

Embodiment 5

Figure 12A:
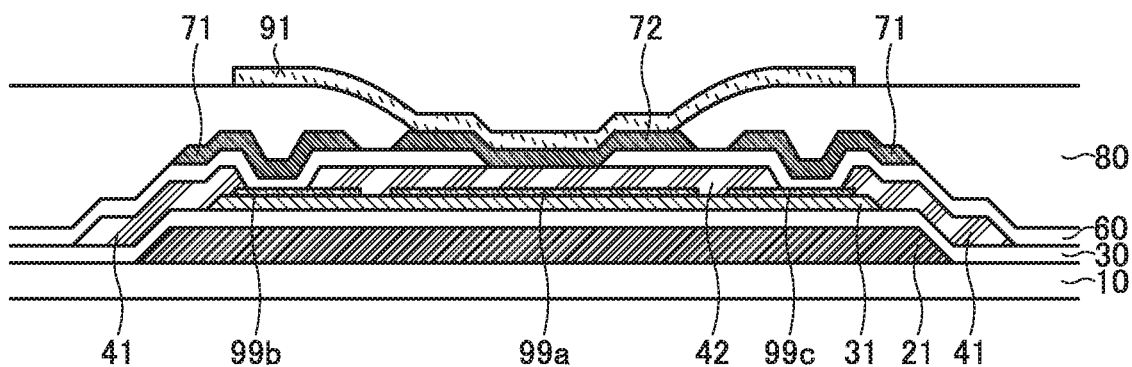
FIGS. 12A and 12B each show an example of a semiconductor device.

An oxide region can be formed between the oxide semiconductor layer 31 and the insulating layer 60.
<FIG. 12A>

For example, in FIG. 12A, an oxide region 99a, an oxide region 99b, and an oxide region 99c are placed over the oxide semiconductor layer 31.

For example, in FIG. 12A, the conductive layer 42 is placed over the oxide region 99a.

For example, in FIG. 12A, the conductive layer 41 and the conductive layer 42 are placed over the oxide region 99b.

For example, in FIG. 12A, the conductive layer 41 and the conductive layer 42 are placed over the oxide region 99c.

For example, in FIG. 12A, the insulating layer 60 is placed over the conductive layer 41, the conductive layer 42, the oxide region 99b, and the oxide region 99c.

The conductive layer 41 has a region in contact with the oxide semiconductor layer 31.

Figure 12B:
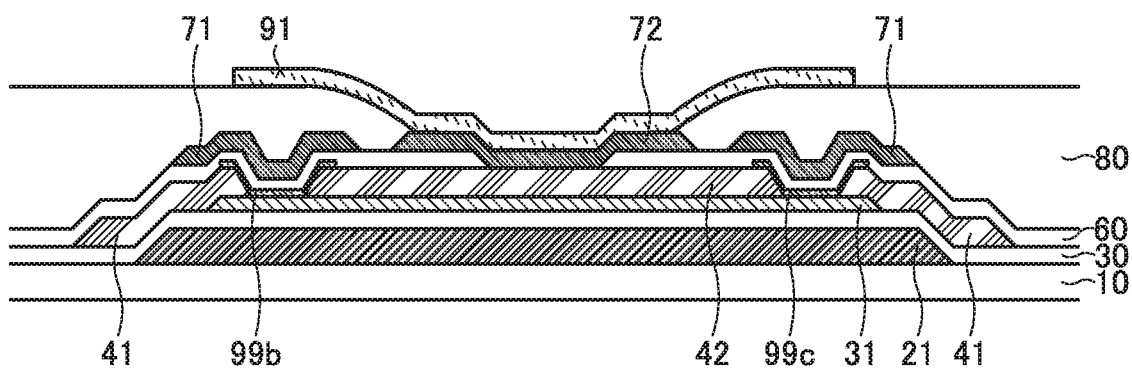

The conductive layer 42 has a region in contact with the oxide semiconductor layer 31.
<FIG. 12B>

For example, in FIG. 12B, the oxide region 99b is placed over the oxide semiconductor layer 31, the conductive layer 41, and the conductive layer 42.

For example, in FIG. 12B, the oxide region 99c is placed over the oxide semiconductor layer 31, the conductive layer 41, and the conductive layer 42.

For example, in FIG. 12B, the insulating layer 60 is placed over the conductive layer 41, and the conductive layer 42, the oxide region 99b, and the oxide region 99c.
<1. Oxide Region>

For example, the oxide region 99a can be a region of a first oxide layer.

For example, the oxide region 99b can be a region of a second oxide layer.

For example, the oxide region 99c can be a region of a third oxide layer.
<2. Oxide Region>

For example, one oxide layer includes the oxide region 99a, the oxide region 99b, and the oxide region 99c.
<Oxide Layer>

For example, the oxide layer is an oxide insulating layer.

For example, the oxide layer is an oxide semiconductor layer with a band gap larger than that of the oxide semiconductor layer 31.

For example, since the oxide layer includes oxygen, the oxide layer has a function of supplying oxygen to the oxide semiconductor layer 31.

For example, with supply of oxygen, the amount of oxygen vacancies in the oxide semiconductor layer 31 can be reduced.
<Oxide Region 99a>

The oxide region 99a is placed between the conductive layer 21 and the conductive layer 42.

With the oxide region 99a, the amount of parasitic capacitance between the conductive layer 21 and the conductive layer 42 can be reduced.
<Oxide Region 99b>

The oxide region 99b is placed between the first channel formation region and the insulating layer 60.

<Oxide Region 99c>

The oxide region 99c is placed between the second channel formation region and the insulating layer 60.

This embodiment can be applied to Embodiment 1 to Embodiment 4.

Embodiment 6

For example, the semiconductor device can be selected from a display device, a memory device, a processor, an RFID, and the like.

This embodiment can be applied to Embodiment 1 to Embodiment 5.

Embodiment 7

In this embodiment, a layer and a material are described.

Materials described in this embodiment are each just an example.
<Layer>

For example, a layer is a single film or a stacked film.

The single film includes one film.

The stacked film includes plural films.

For example, the stacked film has at least a first film and a second film.

For example, the material of the first film is different from that of the second film.

For example, the material of the first film is the same as that of the second film.

For example, each of the materials of the first film and the second film can be selected from materials exemplified in this embodiment.
<Material>

For example, the substrate can be selected from a glass substrate, a plastic substrate, a semiconductor substrate, or the like.

For example, the conductive layer can be a layer including a metal or the like.

For example, the metal can be selected from Al, Ti, Cu, W, Cr, Mo, In, Sn, Zn, or the like.

For example, the insulating layer can be selected from an oxide insulating layer, a nitride insulating layer, an organic insulating layer, or the like.

For example, the oxide insulating layer can include silicon oxide, aluminum oxide, gallium oxide, hafnium oxide, or the like.

For example, the nitride insulating layer can have silicon nitride, aluminum nitride, or the like.

For example, the organic insulating layer can include acrylic, polyimide, siloxane, or the like.

For example, the oxide semiconductor layer can include In, Sn, Zn, Ga, or the like.

For example, the oxide semiconductor layer can be selected from indium oxide, tin oxide, zinc oxide, or the like.

For example, the oxide semiconductor layer can be selected from indium zinc oxide, zinc tin oxide, or the like.

For example, the oxide semiconductor layer can include In, M, and Zn.

For example, the element M can be selected from typical metals, transition metals, or the like.

For example, the transition metal can be Ti, Hf, lanthanoid, actinoid, or the like.
<Crystal Region>

Because the oxide semiconductor layer has a c-axis-aligned crystalline (CAAC) region along the direction X, the density of the oxide semiconductor layer is increased.

By the increased density of the oxide semiconductor layer, $H_2O$ can be prevented from entering the oxide semiconductor layer.

For example, the direction X is a direction perpendicular to the surface of the oxide semiconductor layer.

For example, the angle between the c axis and the surface of the oxide semiconductor layer is 90 degrees.

For example, the direction X is a direction that is substantially perpendicular to the surface of the oxide semiconductor layer.

For example, the angle between the c axis and the surface of the oxide semiconductor layer is from 80 degrees to 100 degrees inclusive.

<Stacked Film>

For example, the oxide semiconductor layer has an oxide semiconductor film A and an oxide semiconductor film B.

For example, the oxide semiconductor film B is placed over the oxide semiconductor film A.

For example, the oxide semiconductor layer has the oxide semiconductor film A, the oxide semiconductor film B, and an oxide semiconductor film C.

For example, the oxide semiconductor film B is placed over the oxide semiconductor film A.

For example, the oxide semiconductor film C is placed below the oxide semiconductor film A.

For example, each of the oxide semiconductor A, the oxide semiconductor B, and the oxide semiconductor C include In, Ga, and Zn.

For example, "the proportion of gallium contained in the oxide semiconductor film B or the proportion of indium contained in the oxide semiconductor film B" is higher than the proportion of gallium contained in the oxide semiconductor film A or the proportion of indium contained in the oxide semiconductor film A".

For example, "the proportion of zinc contained in the oxide semiconductor film B or the proportion of indium contained in the oxide semiconductor film B" is higher than "the proportion of zinc contained in the oxide semiconductor film A or the proportion of indium contained in the oxide semiconductor film A".

For example, "the proportion of gallium contained in the oxide semiconductor film C or the proportion of indium contained in the oxide semiconductor film C" is higher than "the proportion of gallium contained in the oxide semiconductor film A or the proportion of indium contained in the oxide semiconductor film A".

For example, "the proportion of zinc contained in the oxide semiconductor film C or the proportion of indium contained in the oxide semiconductor film C" is higher than "the proportion of zinc contained in the oxide semiconductor film A or the proportion of indium contained in the oxide semiconductor film A".

For example, in the oxide semiconductor film A, the element M can be used instead of Ga.

For example, in the oxide semiconductor film B, the element M can be used instead of Ga.

For example, in the oxide semiconductor film C, the element M can be used instead of Ga.

For example, the element M can be selected from typical metals, transition metals, and the like.

When the proportion of In in the oxide semiconductor film is lower than that of M or Zn, the band gap of the oxide semiconductor film is increased.

When the oxide semiconductor layer is a stacked film, a channel is formed in an oxide semiconductor film having the smallest band gap.

For example, when the oxide semiconductor layer includes the oxide semiconductor film A and the oxide semiconductor film B, a channel is formed in the oxide semiconductor film A.

For example, when the oxide semiconductor layer includes the oxide semiconductor film A, the oxide semiconductor film B, and the oxide semiconductor film C, a channel is formed in the oxide semiconductor film A.

The channel formed in the oxide semiconductor film A is apart from defects at the interface with a gate insulating layer.

The reliability of the transistor is improved by distancing its channel from such defects.

<Semiconductor Layer>

For example, a silicon semiconductor layer may be used instead of the oxide semiconductor layer.

The semiconductor layer generally includes a silicon semiconductor layer and an oxide semiconductor layer.

This embodiment can be applied to Embodiment 1 to Embodiment 6.

This application is based on Japanese Patent Application serial no. 2013-154537 filed with Japan Patent Office on Jul. 25, 2013, the entire contents of which are hereby incorporated by reference.

What is claimed is:

1. A semiconductor device comprising:
a first conductive layer;
a first insulating layer over the first conductive layer;
an oxide semiconductor layer over the first insulating layer;
a second conductive layer over the oxide semiconductor layer;
a third conductive layer over the oxide semiconductor layer;
a second insulating layer over the second conductive layer and the third conductive layer;
a fourth conductive layer over the second insulating layer;
a fifth conductive layer over the second insulating layer;
a third insulating layer over the fourth conductive layer and the fifth conductive layer; and
a sixth conductive layer over the third insulating layer,
wherein the oxide semiconductor layer includes a first channel formation region of a first transistor,
wherein the oxide semiconductor layer includes a second channel formation region of a second transistor, and
wherein the first conductive layer includes a region functioning as a first gate electrode of the first transistor and a region functioning as a second gate electrode of the second transistor.

2. The semiconductor device according to claim 1, wherein the second conductive layer includes a region functioning as one of a source and a drain of the first transistor and a region functioning as one of a source and a drain of the second transistor.

3. The semiconductor device according to claim 2, wherein the third conductive layer includes a region functioning as the other of the source and the drain of the first transistor and a region functioning as the other of the source and the drain of the second transistor.

4. The semiconductor device according to claim 1, wherein the fourth conductive layer includes a region functioning as a third gate electrode of the first transistor and a region functioning as a fourth gate electrode of the second transistor.

5. The semiconductor device according to claim 1, wherein the third conductive layer includes a first region in contact with the fifth conductive layer.

6. The semiconductor device according to claim 5,
wherein the fifth conductive layer includes a second region in contact with the sixth conductive layer.

7. The semiconductor device according to claim 6,
wherein a width of the second region is wider than the width of the first region in a cross-sectional view in a channel direction of the first and second transistors.

8. A semiconductor device comprising:
a first conductive layer;
a first insulating layer over the first conductive layer;
an oxide semiconductor layer over the first insulating layer;
a second conductive layer over the oxide semiconductor layer;
a third conductive layer over the oxide semiconductor layer;
a second insulating layer over the second conductive layer and the third conductive layer;
a fourth conductive layer over the second insulating layer;
a fifth conductive layer over the second insulating layer;
a third insulating layer over the fourth conductive layer and the fifth conductive layer; and
a sixth conductive layer over the third insulating layer,
wherein the oxide semiconductor layer includes a first channel formation region of a first transistor,
wherein the fifth conductive layer overlaps with the first conductive layer and the sixth conductive layer,
wherein the oxide semiconductor layer includes a second channel formation region of a second transistor, and
wherein the first conductive layer includes a region functioning as a first gate electrode of the first transistor and a region functioning as a second gate electrode of the second transistor.

9. The semiconductor device according to claim 8,
wherein the second conductive layer includes a region functioning as one of a source and a drain of the first transistor and a region functioning as one of a source and a drain of the second transistor.

10. The semiconductor device according to claim 9,
wherein the third conductive layer includes a region functioning as the other of the source and the drain of the first transistor and a region functioning as the other of the source and the drain of the second transistor.

11. The semiconductor device according to claim 8,
wherein the fourth conductive layer includes a region functioning as a third gate electrode of the first transistor and a region functioning as a fourth gate electrode of the second transistor.

12. The semiconductor device according to claim 8,
wherein the third conductive layer includes a first region in contact with the fifth conductive layer.

13. The semiconductor device according to claim 12,
wherein the fifth conductive layer includes a second region in contact with the sixth conductive layer.

14. The semiconductor device according to claim 13,
wherein a width of the second region is wider than the width of the first region in a cross-sectional view in a channel direction of the first and second transistors.

15. A semiconductor device comprising:
a first conductive layer;
a first insulating layer over the first conductive layer;
an oxide semiconductor layer over the first insulating layer;
a second conductive layer over the oxide semiconductor layer;
a third conductive layer over the oxide semiconductor layer;
a second insulating layer over the second conductive layer and the third conductive layer;
a fourth conductive layer over the second insulating layer;
a fifth conductive layer over the second insulating layer;
a third insulating layer over the fourth conductive layer and the fifth conductive layer; and
a sixth conductive layer over the third insulating layer,
wherein the oxide semiconductor layer includes a first channel formation region of a first transistor,
wherein the fifth conductive layer is provided between the second conductive layer in plan view,
wherein the oxide semiconductor layer includes a second channel formation region of a second transistor, and
wherein the first conductive layer includes a region functioning as a first gate electrode of the first transistor and a region functioning as a second gate electrode of the second transistor.

16. The semiconductor device according to claim 15,
wherein the second conductive layer includes a region functioning as one of a source and a drain of the first transistor and a region functioning as one of a source and a drain of the second transistor.

17. The semiconductor device according to claim 16,
wherein the third conductive layer includes a region functioning as the other of the source and the drain of the first transistor and a region functioning as the other of the source and the drain of the second transistor.

18. The semiconductor device according to claim 15,
wherein the fourth conductive layer includes a region functioning as a third gate electrode of the first transistor and a region functioning as a fourth gate electrode of the second transistor.

19. The semiconductor device according to claim 15,
wherein the third conductive layer includes a first region in contact with the fifth conductive layer.

20. The semiconductor device according to claim 19,
wherein the fifth conductive layer includes a second region in contact with the sixth conductive layer, and
wherein a width of the second region is wider than the width of the first region in a cross-sectional view in a channel direction of the first and second transistors.

* * * * *